(12) United States Patent
Barth et al.

(10) Patent No.: US 7,851,919 B2
(45) Date of Patent: Dec. 14, 2010

(54) METAL INTERCONNECT AND IC CHIP INCLUDING METAL INTERCONNECT

(75) Inventors: Karl W. Barth, Poughkeepsie, NY (US); Ramona Kei, Hopewell Junction, NY (US); Kaushik A. Kumar, Beacon, NY (US); Kevin S. Petrarca, Newburgh, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/701,045

(22) Filed: Feb. 5, 2010

(65) Prior Publication Data

US 2010/0133694 A1      Jun. 3, 2010

Related U.S. Application Data

(63) Continuation of application No. 11/770,928, filed on Jun. 29, 2007, now Pat. No. 7,718,525.

(51) Int. Cl.
*H01L 21/40* (2006.01)
(52) U.S. Cl. ..................................... 257/758
(58) Field of Classification Search .................. 257/758
See application file for complete search history.

(56) References Cited

U.S. PATENT DOCUMENTS

| | | | |
|---|---|---|---|
| 5,561,318 A | 10/1996 | Gnade et al. | |
| 6,278,174 B1 | 8/2001 | Havemann et al. | |
| 6,534,395 B2 | 3/2003 | Werkhoven et al. | |
| 6,642,138 B2 * | 11/2003 | Pan et al. | 438/619 |
| 6,703,708 B2 | 3/2004 | Werkhoven et al. | |
| 6,933,225 B2 | 8/2005 | Werkhoven et al. | |
| 6,958,524 B2 | 10/2005 | Li et al. | |
| 7,057,287 B2 | 6/2006 | Kumar et al. | |
| 7,129,164 B2 | 10/2006 | Chang et al. | |
| 7,132,732 B2 | 11/2006 | Ohto et al. | |
| 7,135,398 B2 | 11/2006 | Fitzsimmons et al. | |
| 2005/0040532 A1 * | 2/2005 | Kumar et al. | 257/758 |

OTHER PUBLICATIONS

U.S. Appl. No. 11/770,928, filed Jun. 29, 2007, Notice of Allowance And Fees Due, dated Dec. 31, 2009.

(Continued)

*Primary Examiner*—Bradley K Smith
(74) *Attorney, Agent, or Firm*—Katherine S. Brown; Hoffman Warnick LLC

(57) ABSTRACT

A metal interconnect and an IC chip including the metal interconnect are disclosed. One embodiment of the method may include providing an integrated circuit (IC) chip up to and including a middle of line (MOL) layer, the MOL layer including a contact positioned within a first dielectric; recessing the first dielectric such that the contact extends beyond an upper surface of the first dielectric; forming a second dielectric over the first dielectric such that the second dielectric surrounds at least a portion of the contact, the second dielectric having a lower dielectric constant than the first dielectric; forming a planarizing layer over the second dielectric; forming an opening through the planarizing layer and into the second dielectric to the contact; and forming a metal in the opening to form the metal interconnect.

15 Claims, 2 Drawing Sheets

OTHER PUBLICATIONS

U.S. Appl. No. 11/770,928, filed Jun. 29, 2007, Final Office Action dated Oct. 14, 2009.
U.S. Appl. No. 11/770,928, filed Jun. 29, 2007, Amendment to Mar. 9, 2009 Office Action, filed Jun. 9, 2009.
U.S. Appl. No. 11/770,928, filed Jun. 29, 2007, Office Action dated Mar. 9, 2009.
U.S. Appl. No. 11/770,928, filed Jun. 29, 2007.

* cited by examiner

METAL INTERCONNECT AND IC CHIP INCLUDING METAL INTERCONNECT

CROSS-REFERENCE TO RELATED APPLICATION

This application is a continuation of U.S. patent application Ser. No. 11/770,928, filed Jun. 29, 2007, now U.S. Pat. No. 7,718,525.

BACKGROUND

1. Technical Field

The disclosure relates generally to integrated circuit (IC) chip fabrication, and more particularly, to methods of forming a metal interconnect on an IC chip and the IC chip including the metal interconnect.

2. Background Art

In the integrated circuit (IC) chip fabrication industry, there are three sections referred to in a typical IC chip build: front end of the line (FEOL), back end of the line (BEOL) and the section that connects those two together, the middle of the line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and poly-crystalline silicon. The BEOL interconnects are typically made of multiple metals; the bulk of the conductor is copper. If copper diffuses into the FEOL silicon based devices it can cause shorting or alter sensitive transistor characteristics and render the semiconductor useless. This is the reason for the MOL connection. This connection is usually made of tungsten. Although tungsten has a higher resistivity compared to other metals, its ability to prevent copper diffusion while still maintaining high conductivity is extremely desirable. The insulator that the MOL resides in is a higher dielectric constant (high-k, e.g., >3.9) value than the BEOL insulator. The dielectric constant value of the insulator is one major factor that determines the speed at which the signals can travel in that conductor. The high-k MOL insulator is necessary because of its close proximity to the FEOL devices. The high-k MOL insulator is used for various manufacturing issues that are well known in the art.

One challenge relative to current technology is that when the BEOL first metal layer (M1) is processed, typically some portion of the metal line resides in the high-k MOL insulator. That is, the metal protrudes into the high-k MOL insulator, perhaps surrounding a MOL layer contact. Accordingly, the trend of the industry towards low-k materials (e.g., k<3.9) for BEOL insulators is severely hampered by the first line level residing in a high-k insulating material. In particular, any advantage gained by using low-k dielectric is lost for at least the first metal layer of the BEOL by the above situation.

One approach to address this situation is to use a thin layer of high-k dielectric around the contacts of the MOL layer with a low-k material (e.g., hydrogenated silicon oxycarbide (Si-COH)) over the high-k dielectric. Unfortunately, contact materials typically used in the MOL layer (e.g., tungsten) usually require an aggressive planarizing process, which easily damages the less physically robust low-k material.

SUMMARY

A metal interconnect and an IC chip including the metal interconnect are disclosed. Further, methods of forming a metal interconnect and an IC chip including the metal interconnect are disclosed. One embodiment of the method may include providing an integrated circuit (IC) chip up to and including a middle of line (MOL) layer, the MOL layer including a contact positioned within a first dielectric; recessing the first dielectric such that the contact extends beyond an upper surface of the first dielectric; forming a second dielectric over the first dielectric such that the second dielectric surrounds at least a portion of the contact, the second dielectric having a lower dielectric constant than the first dielectric; forming a planarizing layer over the second dielectric; forming an opening through the planarizing layer and into the second dielectric to the contact; and forming a metal in the opening to form the metal interconnect.

A first aspect of the disclosure provides a method of forming a metal interconnect, the method comprising: providing an integrated circuit (IC) chip up to and including a middle of line (MOL) layer, the MOL layer including a contact positioned within a first dielectric; recessing the first dielectric such that the contact extends beyond an upper surface of the first dielectric; forming a second dielectric over the first dielectric such that the second dielectric surrounds at least a portion of the contact, the second dielectric having a lower dielectric constant than the first dielectric; forming a planarizing layer over the second dielectric; forming an opening through the planarizing layer and into the second dielectric to the contact; and forming a metal in the opening to form the metal interconnect.

A second aspect of the disclosure provides a method of forming a metal interconnect, the method comprising: providing an integrated circuit (IC) chip up to and including a middle of line (MOL) layer, the MOL layer including a contact positioned within a high dielectric constant (high-k) dielectric; recessing the high-k dielectric such that the contact extends beyond an upper surface of the high-k dielectric; forming a low dielectric constant (low-k) dielectric over the high-k dielectric such that the low-k dielectric surrounds at least a portion of the contact; forming a planarizing layer over the low-k dielectric by forming a non-photoactive polymer layer over the low-k dielectric and a low temperature oxide (LTO) layer over the non-photoactive polymer layer; forming an opening through the planarizing layer and into the low-k dielectric to the contact by performing a reactive ion etch (RIE) to open the LTO layer and etching the planarizing layer and the low-k dielectric at substantially the same rate; and forming a metal in the opening to form the metal interconnect.

A third aspect of the disclosure provides an integrated circuit (IC) chip comprising: a middle-of-the-line (MOL) layer including a high dielectric constant (high-k) dielectric; a first metal layer above the MOL layer, the first metal layer including a low dielectric constant (low-k) dielectric; and a metal interconnect including: a contact having a first portion in the high-k dielectric of the MOL layer and a second portion in the low-k dielectric of the first metal layer, and a wire coupled to the contact and positioned in the low-k dielectric of the first metal layer, wherein the low-k dielectric of the first metal layer extends beyond a lower surface of a liner layer of the wire.

A fourth aspect of the disclosure provides an integrated circuit (IC) chip comprising: a middle-of-the-line (MOL) layer including a high dielectric constant (high-k) dielectric; a first metal layer above the MOL layer, the first metal layer including a low dielectric constant (low-k) dielectric; and a plurality of metal interconnects, each of the plurality of metal interconnects including: a contact having a first portion in the high-k dielectric of the MOL layer and a second portion in the low-k dielectric of the first metal layer, and a wire coupled to the contact and positioned in the low-k dielectric of the first metal layer, wherein the low-k dielectric of the first metal layer extends beyond a lower surface of a liner layer of the wire of each of the plurality of metal interconnects, and wherein a portion of the low-k dielectric of the first metal layer is positioned between the high-k dielectric and the wire of each of the plurality of metal interconnects.

A fifth aspect of the disclosure provides an integrated circuit (IC) chip comprising: a middle-of-the-line (MOL) layer including a high dielectric constant (high-k) dielectric, wherein the high-k dielectric includes a silicon dioxide ($SiO_2$); a first metal layer above the MOL layer, the first metal layer including a low dielectric constant (low-k) dielectric, wherein the low-k dielectric is selected from the group consisting of: a spin-on polymer, vapor deposited SiLK™, vapor deposited hydrogenated silicon oxycarbide (SiCOH) and organosilicates; and a metal interconnect including: a contact having a first portion in the high-k dielectric of the MOL layer and a second portion in the low-k dielectric of the first metal layer, and a wire coupled to the contact and positioned in the low-k dielectric of the first metal layer, wherein the low-k dielectric of the first metal layer extends beyond a lower surface of a liner layer of the wire, and wherein a portion of the low-k dielectric of the first metal layer is positioned between the high-k dielectric and the wire of each of the plurality of metal interconnects.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 4:
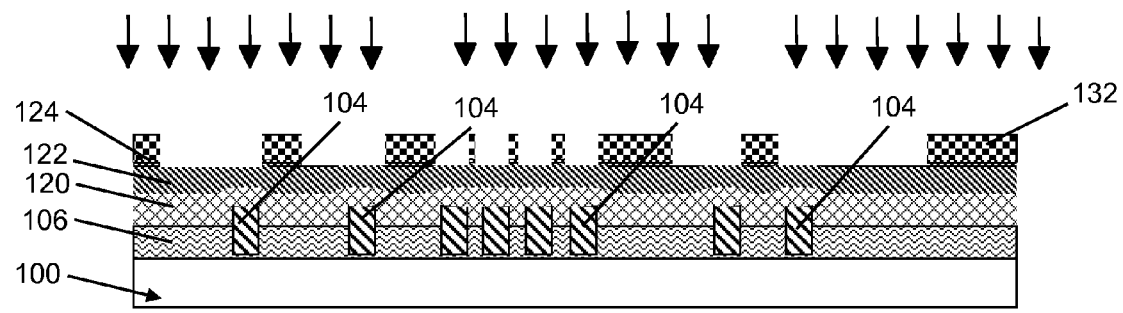
Figure 5:
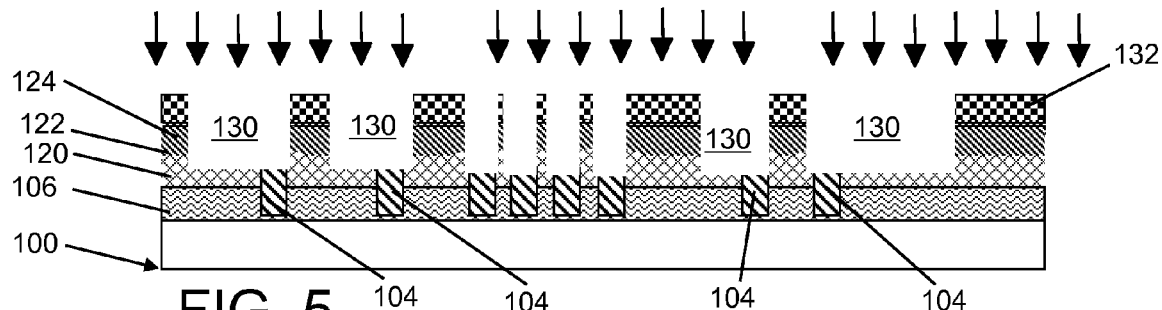
Figure 6:
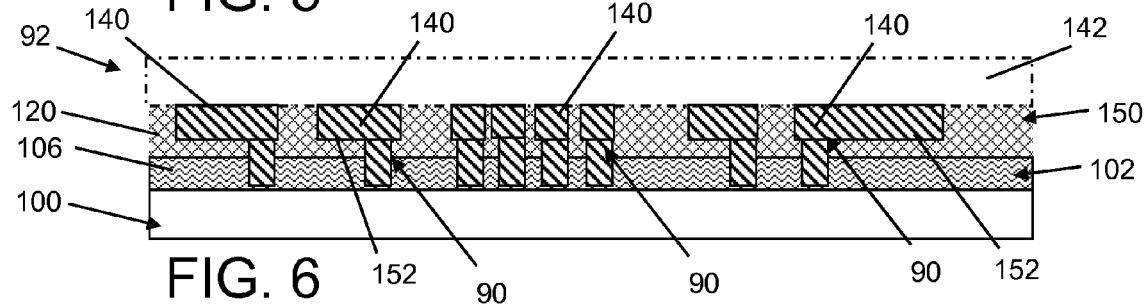

FIGS. 1-6 show embodiments of a method of forming a metal interconnect 90 (FIG. 6) according to the disclosure, with FIG. 6 showing an IC chip 92 according to the disclosure. As used herein, "forming" of a material layer may include any process appropriate for the material being formed, e.g., any of a variety of deposition techniques, epitaxial growth, etc.

Figure 1:
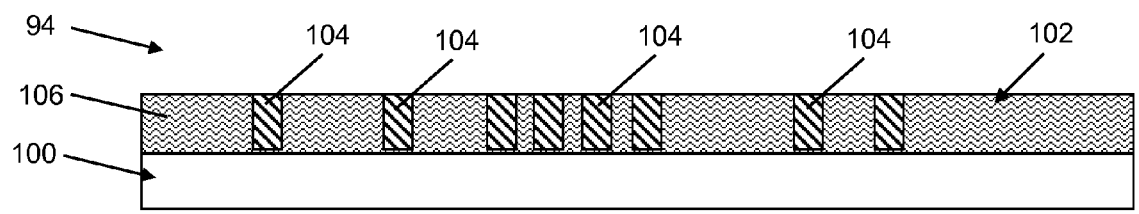
FIGS. 1-6 show embodiments of a method of forming a metal interconnect according to the disclosure, with FIG. 6 showing an IC chip according to the disclosure.

FIG. 1 shows providing an IC chip 94 including a device layer 100, i.e., including transistor devices, etc., (not shown). IC chip 94 is fabricated up to and including a middle of line (MOL) layer 102 over device layer 100 using any now known or later developed processes. MOL layer 102 includes a contact 104 positioned within a high dielectric constant (high-k) dielectric 106, i.e., any dielectric having k≧3.9. In one embodiment, contact 104 may include tungsten (W), copper (Cu) or aluminum (Al). Contact 104 may also include any appropriate liner including refractory metals and/or nitrides thereof. Further, in one embodiment, high-k dielectric 106 may include, for example, a silicon dioxide ($SiO_2$) (e.g., undoped silicon glass (USG)) or borophosphosilicate glass (BPSG)), tetraethyl orthosilicate $Si(OC_2H_5)_4$ (TEOS). As understood by those with ordinary skill in the art, contact 104 is electrically coupled to parts of devices within device layer 102, e.g., gates or source/drain regions of transistors.

Figure 2:
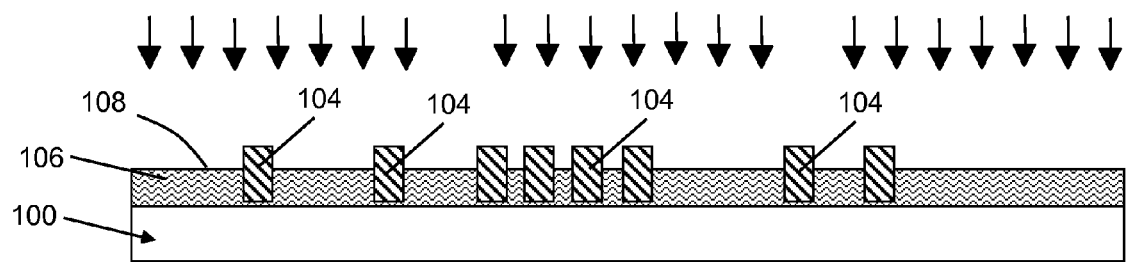

FIG. 2 shows recessing high-k dielectric 106 such that contact 104 extends beyond an upper surface 108 of the high-k dielectric. The recessing may be achieved, for example, by using dilute hydrofluoric (HF) acid of concentrations of 100:1 to 300:1 in de-ionized water. This process will recess high-k dielectric 106 selectively to contact 104. As will be described further herein, the amount of the recessing may be selected to prevent overetching during subsequent opening forming (FIG. 5).

Figure 3:
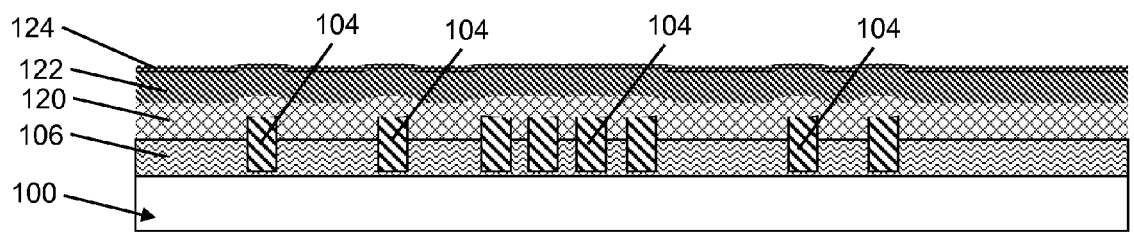

FIG. 3 shows forming a low dielectric constant (low-k) dielectric 120 over high-k dielectric 106 such that low-k dielectric 120 surrounds at least a (upper) portion of contact 104, i.e., that portion extending beyond high-k dielectric 106 (FIG. 2). Low-k dielectric 120 may include, for example, a spin-on polymer, vapor deposited SiLK™ (available from Dow Chemical), vapor deposited hydrogenated silicon oxycarbide (SiCOH), organosilicates or other porous low-k dielectrics. In any event, low-k dielectric 120 (e.g., k<3.9) has a lower dielectric constant than high-k dielectric 106. Since low-k dielectric 120 is conformal, FIG. 3 also shows forming a planarizing layer 122, 124 over low-k dielectric 120 so that further photolithography based processing may proceed. In one embodiment, this process may include forming a non-photoactive polymer layer 122 (e.g., NFC™ available from JSR), and forming a (thin) low temperature oxide (LTO) layer 124 over non-photoactive polymer layer 122. Other single or multiple layer material may also be employed.

As shown in FIGS. 4-5, forming an opening 130 (FIG. 5) through planarizing layer 122, 124 (FIG. 4) and into low-k dielectric 120 to contact 104 is next. This process may include patterning a mask 132, first etching (FIG. 4) to open LTO layer 124 and second etching (FIG. 5) planarizing layer 122, 124 and low-k dielectric 120 at substantially the same rate. The first etching (FIG. 4) of LTO layer 124 may include a non-selective reactive ion etch (RIE) and can be selective to the underlying non-photoactive polymer layer 122 by the use of hydrogen ($H_2$) and tetrafluoromethane ($CF_4$) type plasma chemistries. In this case, the selectivity can be as high as or greater than approximately 10:1. This process can also use an end-pointed non-selective type of etching using carbon-fluorine ($CF_x$) based plasmas.

As shown in FIG. 5, second etching of planarizing layer 122, 124 and low-k dielectric 120 is at substantially the same rate for both materials. In one embodiment, this process may include using a plasma condition that has a selectivity between LTO layer 124 and non-photoactive polymer layer 122 of approximately 1:1 to achieve uniform depth independent of topography. This process may include use of a fluorocarbon and oxygen based chemistries such as tetrafluoromethane ($CF_4$) and oxygen ($O_2$). This second etching will allow for the formation of the features required in low-k dielectric 120. The second etching is a timed etch to only reach a surface of contact 104. That is, the bottom of opening 130 should be at the surface of contact 104 and a top of low-k dielectric 120. In this regard, the amount of the initial MOL layer 102 (FIG. 2) high-k dielectric 106 recess (FIG. 2) is determined by the ability of the timed etch (FIG. 5) to finish at the surface of contact 104, without overetching. The depth control of second etching (FIG. 5) can be achieved, for example, with the use of integrated metrology instruments (not shown).

Referring to FIG. 6, forming a metal 140 (e.g., copper (Cu) or aluminum (Al)) in opening 130 (FIG. 5) to form metal interconnect 90 is shown. This process may include any now known or later developed processes for forming metal 140 within an opening 130, e.g., performing a cleaning process, forming a liner layer 152, forming a seed layer (not shown for clarity), depositing a metal and planarizing (e.g., chemical mechanical polishing to remove planarizing layers 122, 124, etc.). FIG. 6 also shows forming one or more other back-end-of-line (BEOL) layers 142 over metal interconnect 90 using any now known or later developed processing.

The above-described processing results in IC chip 92 including MOL layer 102 including high-k dielectric 106, a first metal layer 150 above the MOL layer, the first metal layer including low-k dielectric 120. IC chip 92 also includes metal interconnect 90 including contact 104 having a first portion in high-k dielectric 106 of MOL layer 102 and a second portion in low-k dielectric 120 of first metal layer 150, and a wire (metal 140) coupled to contact 104 and positioned in low-k dielectric 120 of first metal layer 150. As shown in FIG. 6, low-k dielectric 120 of first metal layer 150 extends beyond a lower surface of liner layer 152 of the wire. In this situation, the benefits of low-k dielectric 120 are not lost for first metal layer 150 since metal 140 is positioned completely within low-k dielectric 120 rather than entering into high-k dielectric 106 of MOL layer 102. This allows lowering of the effective dielectric constant with respect to the wire thereby lower the RC (resistance multiplied by capacitance) time delay.

The methods and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. An integrated circuit (IC) chip comprising:
a middle-of-the-line (MOL) layer including a high dielectric constant (high-k) dielectric;
a first metal layer above and in direct physical contact with the MOL layer, the first metal layer including a low dielectric constant (low-k) dielectric; and
a metal interconnect including:
a contact having a first portion in the high-k dielectric of the MOL layer and a second portion in the low-k dielectric of the first metal layer, and
a wire coupled to the contact and positioned in the low-k dielectric of the first metal layer,
wherein the low-k dielectric of the first metal layer extends beyond a lower surface of a liner layer of the wire.

2. The IC chip of claim 1, wherein the contact includes a material selected from the group consisting of: tungsten (W), copper (Cu) and aluminum (Al).

3. The IC chip of claim 1, wherein the high-k dielectric includes a silicon dioxide (SiO2), and the low-k dielectric is selected from the group consisting of: a spin-on polymer, vapor deposited SiLK™, vapor deposited hydrogenated silicon oxycarbide (SiCOH) and organosilicates.

4. The IC chip of claim 1, further comprising a back-end-of-line (BEOL) layer over the first metal layer and the metal interconnect.

5. The IC chip of claim 1, wherein a portion of the low-k dielectric of the first metal layer is positioned between the high-k dielectric and the wire.

6. The IC chip of claim 1, wherein the low-k dielectric has a dielectric constant value of less than approximately 3.9.

7. The IC chip of claim 6, wherein the high-k dielectric has a dielectric constant value of greater than approximately 3.9.

8. An integrated circuit (IC) chip comprising:
a middle-of-the-line (MOL) layer including a high dielectric constant (high-k) dielectric;
a first metal layer above and in direct physical contact with the MOL layer, the first metal layer including a low dielectric constant (low-k) dielectric; and
a plurality of metal interconnects, each of the plurality of metal interconnects including:
a contact having a first portion in the high-k dielectric of the MOL layer and a second portion in the low-k dielectric of the first metal layer, and
a wire coupled to the contact and positioned in the low-k dielectric of the first metal layer,
wherein the low-k dielectric of the first metal layer extends beyond a lower surface of a liner layer of the wire of each of the plurality of metal interconnects, and wherein a portion of the low-k dielectric of the first metal layer is positioned between the high-k dielectric and the wire of each of the plurality of metal interconnects.

9. The IC chip of claim 8, wherein the contact includes a material selected from the group consisting of: tungsten (W), copper (Cu) and aluminum (Al).

10. The IC chip of claim 8, wherein the high-k dielectric includes a silicon dioxide (SiO2), and the low-k dielectric is selected from the group consisting of: a spin-on polymer, vapor deposited SiLK™, vapor deposited hydrogenated silicon oxycarbide (SiCOH) and organosilicates.

11. The IC chip of claim 8, further comprising a back-end-of-line (BEOL) layer over the metal interconnect and the first metal layer.

12. The IC chip of claim 8, wherein the low-k dielectric has a dielectric constant value of less than approximately 3.9.

13. The IC chip of claim 12, wherein the high-k dielectric has a dielectric constant value of greater than approximately 3.9.

14. The IC chip of claim 8, wherein the low-k dielectric of the first metal layer separates the plurality of metal interconnects.

15. An integrated circuit (IC) chip comprising:
a middle-of-the-line (MOL) layer including a high dielectric constant (high-k) dielectric, wherein the high-k dielectric includes a silicon dioxide (SiO2);
a first metal layer above and in direct physical contact with the MOL layer, the first metal layer including a low dielectric constant (low-k) dielectric, wherein the low-k dielectric is selected from the group consisting of: a spin-on polymer, vapor deposited SiLK™, vapor deposited hydrogenated silicon oxycarbide (SiCOH) and organosilicates; and
a metal interconnect including:
a contact having a first portion in the high-k dielectric of the MOL layer and a second portion in the low-k dielectric of the first metal layer, and
a wire coupled to the contact and positioned in the low-k dielectric of the first metal layer,
wherein the low-k dielectric of the first metal layer extends beyond a lower surface of a liner layer of the wire, and
wherein a portion of the low-k dielectric of the first metal layer is positioned between the high-k dielectric and the wire of each of the plurality of metal interconnects.

* * * * *